United States Patent
Yamamoto et al.

(10) Patent No.: US 10,349,569 B2
(45) Date of Patent: Jul. 9, 2019

(54) COMPONENT MOUNTING DEVICE AND COMPONENT MOUNTING METHOD

(71) Applicant: PANASONIC INTELLECTUAL PROPERTY MANAGEMENT CO., LTD., Osaka (JP)

(72) Inventors: Shinji Yamamoto, Yamanashi (JP); Hiroyuki Fujiwara, Yamanashi (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 585 days.

(21) Appl. No.: 14/769,311

(22) PCT Filed: Feb. 20, 2014

(86) PCT No.: PCT/JP2014/000887
§ 371 (c)(1),
(2) Date: Aug. 20, 2015

(87) PCT Pub. No.: WO2014/129195
PCT Pub. Date: Aug. 28, 2014

(65) Prior Publication Data
US 2015/0382522 A1    Dec. 31, 2015

(30) Foreign Application Priority Data
Feb. 21, 2013 (JP) .................. 2013-031681

(51) Int. Cl.
*H05K 13/04* (2006.01)
*H05K 3/32* (2006.01)
*H05K 13/08* (2006.01)

(52) U.S. Cl.
CPC ........... *H05K 13/0413* (2013.01); *H05K 3/32* (2013.01); *H05K 13/046* (2013.01); *H05K 13/0815* (2018.08)

(58) Field of Classification Search
CPC ............ H05K 13/0413; H05K 13/046; H05K 13/0069; H05K 13/0408; H05K 13/0404;
(Continued)

(56) References Cited

U.S. PATENT DOCUMENTS 3,623,637 A * 11/1971 Miller ................ H05K 13/0408
221/61
4,346,514 A * 8/1982 Makizawa ......... H05K 13/0408
228/6.2
(Continued)

FOREIGN PATENT DOCUMENTS

CN    102273333 A    12/2011
CN    102740676 A    10/2012
(Continued)

OTHER PUBLICATIONS

Decision of Refusal for Japanese Patent Application No. 2013-031682 dispatched Dec. 8, 2015.
(Continued)

*Primary Examiner* — Peter Dungba Vo
*Assistant Examiner* — Jeffrey T Carley
(74) *Attorney, Agent, or Firm* — Pearne & Gordon LLP

(57) ABSTRACT

A component mounting device which mounts on a board electronic components including a fitting component to be attached by a mechanical fitting or engagement to a to-be-attached part formed in the board. The component mounting device includes a moving and mounting head which holds and takes out the fitting component by a holding unit from a component supply part to move and mount the fitting component on the to-be-attached part of the board, and a pressing head which presses the fitting component that is moved and mounted on the to-be-attached part by a pressing unit to attach the fitting component to the to-be-attached part.

3 Claims, 9 Drawing Sheets

(58) Field of Classification Search
CPC ...... H05K 3/32; H05K 3/301; Y10T 29/4913; Y10T 29/53174; Y10T 29/53191; Y10T 29/53261
See application file for complete search history.

(56) References Cited

U.S. PATENT DOCUMENTS

| | | | | |
|---|---|---|---|---|
| 4,882,298 | A | 11/1989 | Moeller et al. | |
| 5,115,545 | A * | 5/1992 | Fujimoto | H05K 13/046 228/180.22 |
| 5,195,821 | A * | 3/1993 | Eguchi | H05K 13/0413 29/834 |
| 5,556,293 | A | 9/1996 | Pfaff | |
| 5,903,662 | A * | 5/1999 | DeCarlo | H05K 13/0812 382/151 |
| 6,098,272 | A * | 8/2000 | Paulus | B23P 21/00 156/556 |
| 6,103,039 | A * | 8/2000 | Paulus | B29C 65/7847 156/222 |
| 6,110,563 | A * | 8/2000 | Pienimaa | H05K 3/284 156/278 |
| 6,167,683 | B1 * | 1/2001 | Wong | B65B 9/042 137/595 |
| 6,254,809 | B1 * | 7/2001 | Parent | B29C 65/1467 156/275.5 |
| 6,839,959 | B1 * | 1/2005 | Hosotani | H01L 21/67144 29/721 |
| 7,371,143 | B2 * | 5/2008 | Becken | C03C 27/06 445/25 |
| 7,407,423 | B2 * | 8/2008 | Aitken | C03C 3/072 445/23 |
| 7,597,603 | B2 | 10/2009 | Becken et al. | |
| 7,948,175 | B2 * | 5/2011 | Kurihara | H01L 51/5246 313/504 |
| 2001/0048234 | A1 | 12/2001 | Liu et al. | |
| 2008/0117591 | A1 * | 5/2008 | Hashikura | H05K 7/026 361/694 |
| 2008/0192447 | A1 | 8/2008 | Koyama et al. | |
| 2009/0300908 | A1 * | 12/2009 | Endo | H05K 13/04 29/739 |
| 2011/0289772 | A1 | 12/2011 | Kosaka et al. | |

FOREIGN PATENT DOCUMENTS

| | | | | |
|---|---|---|---|---|
| JP | 2001-168592 A | * | 6/2001 | ............ H05K 13/04 |
| JP | 2001-168592 A | | 6/2001 | |
| JP | 2001-196794 A | | 7/2001 | |
| JP | 2006-147884 A | | 6/2006 | |
| JP | 2010-027661 A | | 2/2010 | |
| JP | 2010-206059 A | | 9/2010 | |
| JP | 2012-222035 A | | 11/2012 | |
| WO | 0069241 A1 | | 11/2000 | |

OTHER PUBLICATIONS

International Search Report for Application No. PCT/JP2014/000886 dated Apr. 8, 2014.
International Search Report for Application No. PCT/JP2014/000887 dated Apr. 8, 2014.
Microfilm of the specification and drawings annexed to the request of Japanese Utility Model Application No. 018701/1990 (Laid-open No. 110900/1991) (Taiyo Yuden Co., Ltd.), Nov. 13, 1991 (Nov. 13, 1991).
United States Office Action issued in U.S. Appl. No. 14/769,227 dated Jan. 17, 2018.
United States Office Action issued in U.S. Appl. No. 14/769,227 dated Jul. 11, 2018.

* cited by examiner

COMPONENT MOUNTING DEVICE AND COMPONENT MOUNTING METHOD

TECHNICAL FIELD

The present invention relates to a component mounting device and a component mounting method by which electronic components are mounted on a board.

BACKGROUND ART

In a component mounting device used in a component mounting line which manufactures a mounting board, objects to be mounted include not only surface mount components such as chip type components or a semiconductor device which are attached to lands of a surface of the board by solder joint, but also fitting components such as a connector or a shield component which are fixed to the board or a component already mounted on the board by using fitting pins or engaging protrusions. A mounting operation of such fitting components requires a pushing operation which applies a pressing force to the components such as an operation for fitting the fitting pin to a fitting hole provided in the board or an operation for allowing the engaging protrusion to be engaged with an engaging part provided in the already-mounted component in addition to a moving and mounting movement in which the components taken out from a component supply part are held, accurately positioned, and landed on mounting positions.

A technique is proposed that a form of a holding unit which is attached to a mounting head to hold a component or an operation mode of the mounting head is devised so as to set the above-described fitting components as the objects to be mounted in general component mounting devices (for instance, see patent literature 1). The related art illustrated in this patent literature discloses an example that the component is moved and mounted with a position suitable for conveying the component held by the holding unit, and then, a position of the holding unit is moved to a position suitable for the pushing operation a plurality of times to carry out the pushing operation.

CITATION LIST

Patent Literature

[PLT 1] JP-A-2010-27661

SUMMARY OF INVENTION

Technical Problem

However, in the example of the above-described related art, the moving and mounting operation of the component and the pushing operation are carried out by the common holding unit, so that a below-described inconvenience arises. Namely, when the component is moved and mounted, since the holding unit is merely required to hold the component in a proper attitude, the holding unit does not require a large rigidity in respect of strength. As compared therewith, in the pushing operation, since the pressing force is required which corresponds to a preset and prescribed fitting accuracy or engagement strength. Therefore, when the single holding unit is used in common for the moving and mounting operation and the pushing operation, inconveniences arise, such as a deformation due to an insufficient strength or an interference with other components due to an improper size.

For instance, when a necessary pushing force is to be ensured, an excessively large pressing force is applied to the holding unit to deform the holding unit. Thus, a positional accuracy or stability when the component is held is damaged. Further, when the size of the holding unit is allowed to be large to increase the rigidity of the holding unit, a positional interference with the previously mounted other component may possibly arise when the holding unit is moved to a position suitable for the pushing operation. As described above, in the related-art component mounting device and the component mounting method, when the fitting components are included in the objects to be mounted, a problem arises that it is difficult to stably carry out the component moving and mounting operation and the pushing operation.

Thus, it is an object of the present invention to provide a component mounting device and a component mounting method in which a component moving and mounting operation and a pushing operation for the fitting component as an object to be mounted can be stably carried out.

Solution to Problem

A component mounting device of the present invention is a component mounting device that mounts on a board electronic components including a fitting component to be attached by a mechanical fitting or engagement to a to-be-attached part formed in the board. The component mounting device includes a moving and mounting head which holds and takes out the fitting component by a holding unit from a component supply part to move and mount the fitting component on the to-be-attached part of the board, and a pressing head which presses the fitting component that is moved and mounted on the to-be-attached part by a pressing unit to attach the fitting component to the to-be-attached part.

A component mounting method of the present invention is a component mounting method that mounts on a board electronic components including a fitting component to be attached by a mechanical fitting or engagement to a to-be-attached part formed in the board. The component mounting method includes a moving and mounting process of holding and taking out the fitting component by a holding unit attached to a moving and mounting head from a component supply part to move and mount the fitting component on the to-be-attached part of the board; and a pressing process of pressing the fitting component that is moved and mounted on the to-be-attached part by a pressing unit attached a pressing head to attach the fitting component to the to-be-attached part.

Advantageous Effects of Invention

According to the present invention, when the fitting component to be attached by a mechanical fitting or engagement to a to-be-attached part is mounted on the board, the fitting component is held and taken out by the holding unit attached to the moving and mounting head from the component supply part to move and mount the fitting component on the to-be-attached part of the board and the moved and mounted fitting component is pressed by the pressing unit attached to the pressing head separate from the moving and mounting head to attach the fitting component to the to-be-attached part. Thus, the pressing force can be constantly properly maintained during the pushing operation, and the component moving and mounting operation and the pushing operation for the fitting component as an object to be mounted can be stably carried out.

DESCRIPTION OF EMBODIMENTS

Figure 1:
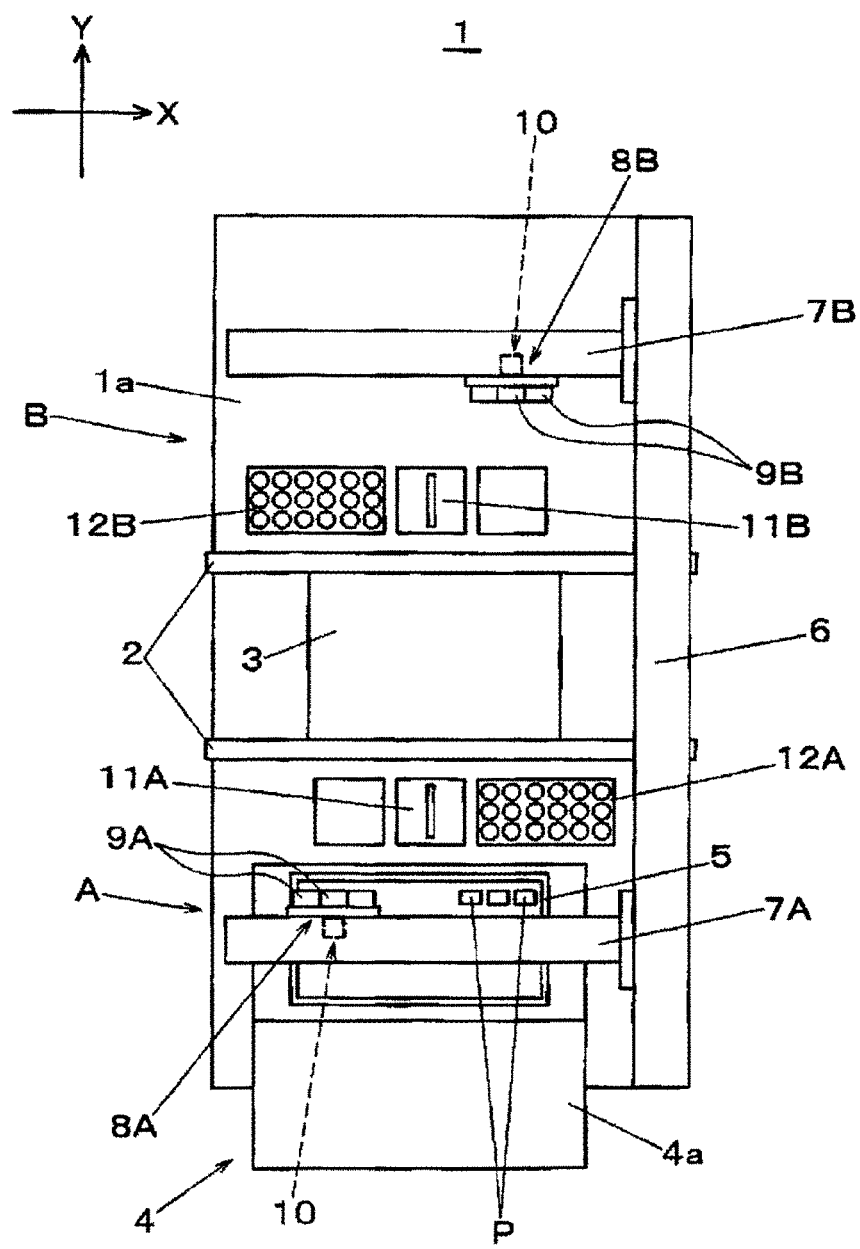
FIG. 1 is a plan view of a component mounting device of an embodiment of the present invention.

Now, embodiments of the present invention will be described below by referring to the drawings. Initially, by referring to FIG. 1, a structure of a component mounting device 1 will be described below. The component mounting device 1 has a function which mounts on a board electronic components including a fitting component to be attached to a to-be-attached part formed in the board to which the fitting component is attached by a mechanical fitting or engagement. In FIG. 1, in a base 1a, a board conveying part 2 is arranged in a direction X (a board conveying direction). The board conveying part 2 conveys a board 3 as an object of a mounting operation to position and hold the board on a working position by a below-described component mounting mechanism.

At both side parts of the board conveying part 2, a component moving and mounting part A and a component pressing part B are arranged. In the component moving and mounting part A, a component supply part 4 is provided which supplies components as objects to be mounted. In the component supply part 4, a tray feeder 4a is arranged which supplies component trays 5. In the component trays 5, the above-described fitting components P such as a connector component and a shield component which are relatively large in size are arranged in a plane. The component pressing part B has a function which applies a pressing force to the fitting components P which are moved and mounted on the board 3 by the component moving and mounting part A to mechanically fit or engage the fitting component P with the to-be-attached parts formed on the board 3.

In an end part of one side in the direction X of the base 1a, a Y-axis table 6 in which a linearly moving mechanism driven by a linear motor is incorporated is arranged in a direction Y. To the Y-axis table 6, X-axis tables 7A and 7B in which similar linearly moving mechanisms are incorporated are connected so as to be freely movable in the direction Y. To the X-axis tables 7A and 7B respectively, mounting heads 8A and 8B are attached so as to be freely movable in the direction X. The mounting heads 8A and 8B are respectively configured to have a plurality of unit holding heads 9A and 9B arranged in parallel. To the mounting heads 8A and 8B, board recognition cameras 10 located in lower surface sides of the X-axis tables 7A and 7B and moving together therewith are attached with their imaging surfaces directed downward.

When the Y-axis table 6 and the X-axis table 7A are driven, the mounting head 8A and the board recognition camera 10 are horizontally moved in the direction X and the direction Y, and the fitting component P is taken from the component tray 5, and moved and mounted on the board 3 by the unit holding heads 9A. Further, the board recognition camera 10 which is moved to an upper part of the board 3 images the board 3, so that a position of a recognition mark is recognized. Further, when the Y-axis table 6 and the X-axis table 7B are driven, the mounting head 8B and the board recognition camera 10 are horizontally moved in the direction X and the direction Y, and the pressing force is applied to the fitting component P moved and mounted on the board 3 by the unit holding heads 9B.

In both sides of the board conveying part 2 in the component moving and mounting part A and the component pressing part B, component recognition cameras 11A and 11B and nozzle accommodating parts 12A and 12B are respectively arranged. When the mounting heads 8A and 8B are moved on upper parts of the component recognition cameras 11A and 11B, the component recognition cameras 11A and 11B respectively image the unit holding heads 9A and 9B from below to recognize the unit holding heads 9A and 9B. In the nozzle accommodating parts 12A and 12B, a plurality of kinds of suction nozzles 37A and pressing tools 37B to be attached to the unit holding heads 9A and 9B are accommodated. When the mounting heads 8A and 8B approach the nozzle accommodating parts 12A and 12B to carry out a tool exchanging operation, the suction nozzles 37A and the pressing tools 37B which are suitable for their uses and object components are attached to the unit holding heads 9A and 9B.

Figure 2B:
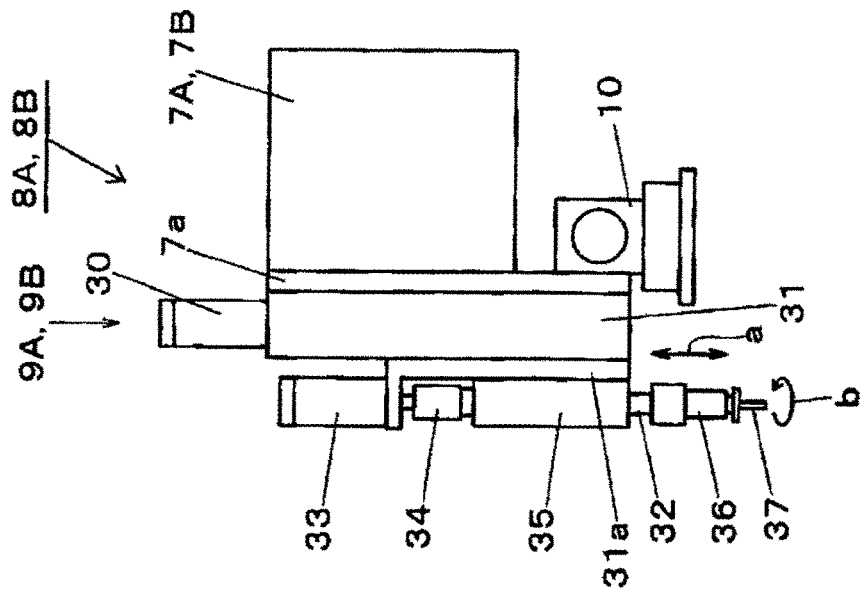
FIGS. 2(a) and 2(b) are structure explanatory views of a mounting head of the component mounting device of the embodiment of the present invention.
Figure 2A:
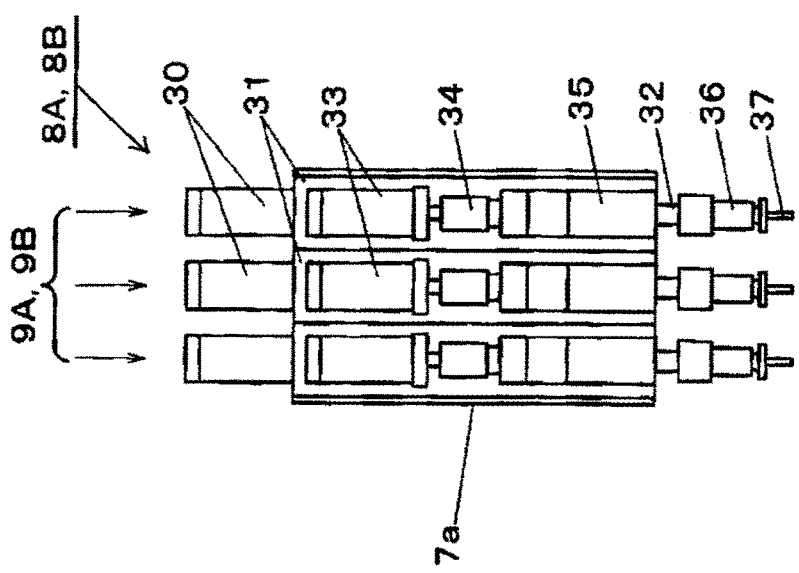

Now, by referring to FIGS. 2(a) and 2(b), structures of the mounting heads 8A and 8B will be described below. The mounting heads 8A and 8B have the same structures. As illustrated in FIG. 2(a), a plurality (here, three) of unit holding heads 9A and 9B are arranged in parallel at the same arrangement pitches in moving plates 7a connected to the X-axis tables 7A and 7B. As illustrated in FIG. 2(b), the board recognition cameras 10 which are located below the mounting heads 8A and 8B are attached to the moving plates 7a.

The unit holding heads 9A and 9B include nozzle elevating mechanisms 31 having structures which move up and down (an arrow a) elevating brackets 31a by the linearly moving mechanisms driven by nozzle elevating motors 30. To front surfaces of the elevating brackets 31a, holding members 35 are connected. In the holding members 35, nozzle shaft parts 32 are held so as to freely rotate. To lower end parts of the nozzle shaft parts 32, nozzle holding parts 36 are attached which hold nozzles 37 such as the suction nozzles or the pressing tools so as to be exchangeable.

To the nozzle holding part 36, a rotation of a nozzle θ rotation motor 33 is transmitted through a nozzle pressing mechanism 34 and the nozzle shaft part 32 to rotate the nozzle 37 by θ on an axis (an arrow b) so that an alignment in a direction θ may be achieved when the component is mounted. The nozzle pressing mechanism 34 incorporates therein a pressing load adjusting part 34a having a function for applying a desired pressing load to the nozzle 37. Thus, the pressing load can be set according to the property or the mounting form of the component as an object to be mounted.

Figure 3A:
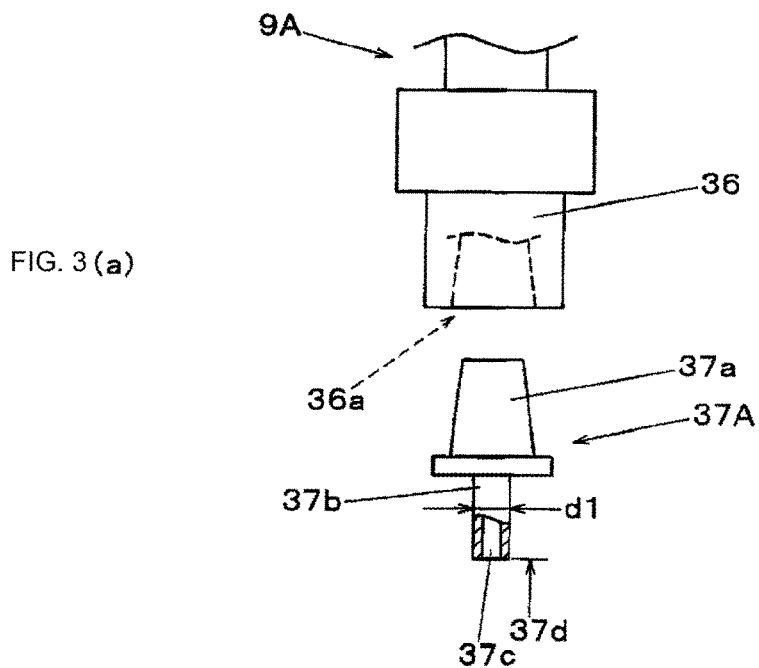
FIGS. 3(a) and 3(b) illustrate structure and functional explanatory views of a suction nozzle attached to the mounting head of the component mounting device of the embodiment of the present invention.

Now, by referring to FIGS. 3(a) and 3(b), will be described a structure and a function of the suction nozzle 37A to be attached to the unit holding head 9A which belongs to the mounting head 8A of the component moving and mounting part A. As illustrated in FIG. 3(a), to an attachment hole 36a provided in the nozzle holding part 36 of the unit holding head 9A, an attaching part 37a provided in an upper part of the suction nozzle 37A is detachably fitted. In the suction nozzle 37A, in a suction shaft 37b extending downward, a suction hole 37c is provided to open to a suction surface 37d. Thus, the component which abuts on the suction surface 37d can be sucked and held by vacuum suction through the suction hole 37c by a vacuum suction source provided in the unit holding head 9A. Here, a diameter dimension d1 of the suction shaft 37b is set to such a diameter size as to stably suck the fitting component P relatively large in size as an object to be held.

Figure 3B:
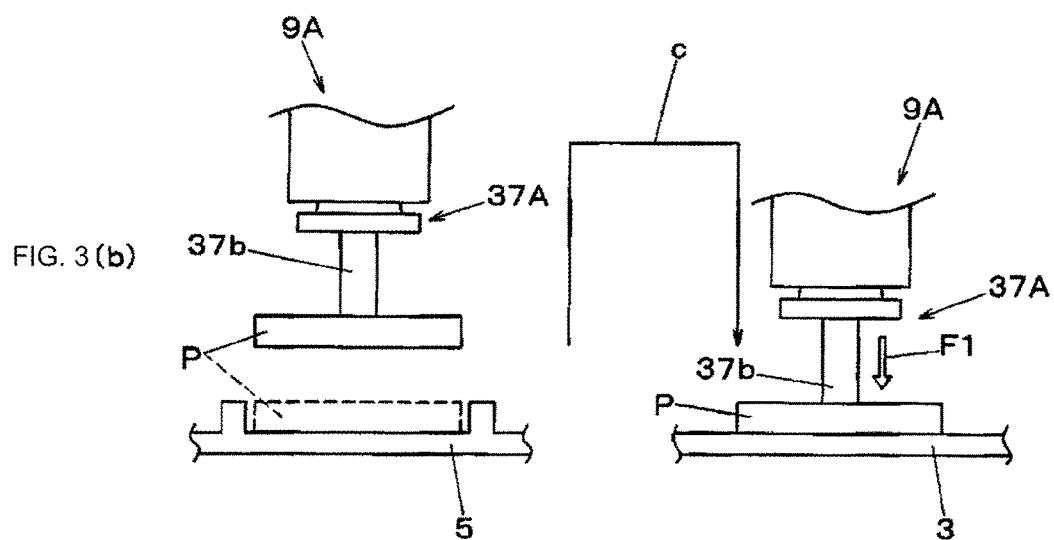

When the mounting head 8A is moved to the component supply part 4 so that the unit holding head 9A is moved up and down relative to the component tray 5 as illustrated in FIG. 3(b), the fitting component P as the object to be mounted which is accommodated in the component tray 5 can be held by the suction nozzle 37A. Then, the mounting head 8A is moved to the board 3 to lower the unit holding head 9A on a component mounting position of the board 3. Thus, the fitting component P held by the suction nozzle 37A is moved and mounted on the component mounting position of the board 3. At this time, the unit holding head 9A presses through the suction shaft 37b the fitting component P by a first load F1 previously set for mounting the component. Namely, the mounting head 8A functions as a moving and mounting head that carries out a moving and mounting operation which holds and takes out the fitting component P by the suction shaft 37b of the suction nozzle 37A as a holding unit from the component supply part 4, moves and mounts the fitting component P on the component mounting position that is a to-be-attached part of the board 3 and presses the fitting component P by the first load F1.

Figure 4:
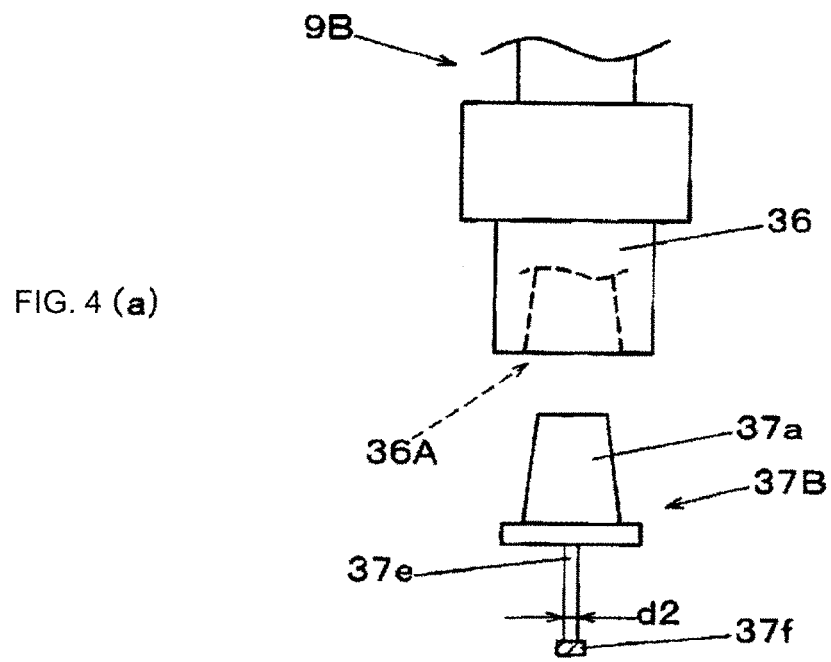
FIGS. 4(a) and 4(b) illustrate structure and functional explanatory views of a pressing tool attached to the mounting head of the component mounting device of the embodiment of the present invention.

Now, referring to FIGS. 4(a) and 4(b), will be described a structure and a function of the pressing tool 37B attached to the unit holding head 9B which belongs to the mounting head 8B of the component pressing part B. As illustrated in FIG. 4(a), to an attachment hole 36a provided in the nozzle holding part 36 of the unit holding head 9B, an attaching part 37a provided in an upper part of the pressing tool 37B is detachably fitted. The pressing tool 37B includes a pressing shaft 37e extending downward to abut on and press an upper surface of the fitting component P. A diameter dimension d2 of the pressing shaft 37e is desired to be small as much as possible so that a press part of a narrow range may be set as an object when the pressing shaft 37e presses the upper surface of the fitting component P. Accordingly, the diameter dimension d2 is set to be smaller than the diameter dimension d1 of the suction shaft 37b of the suction nozzle 37A. To a tip end part of the pressing shaft 37e, is attached a cushion member 37f made of an elastic material having a shock absorbing property such as a resin or rubber. Since the cushion member 37f is provided in a contact part with the fitting component P, an impact during an abutment is buffered.

Figure 4B:
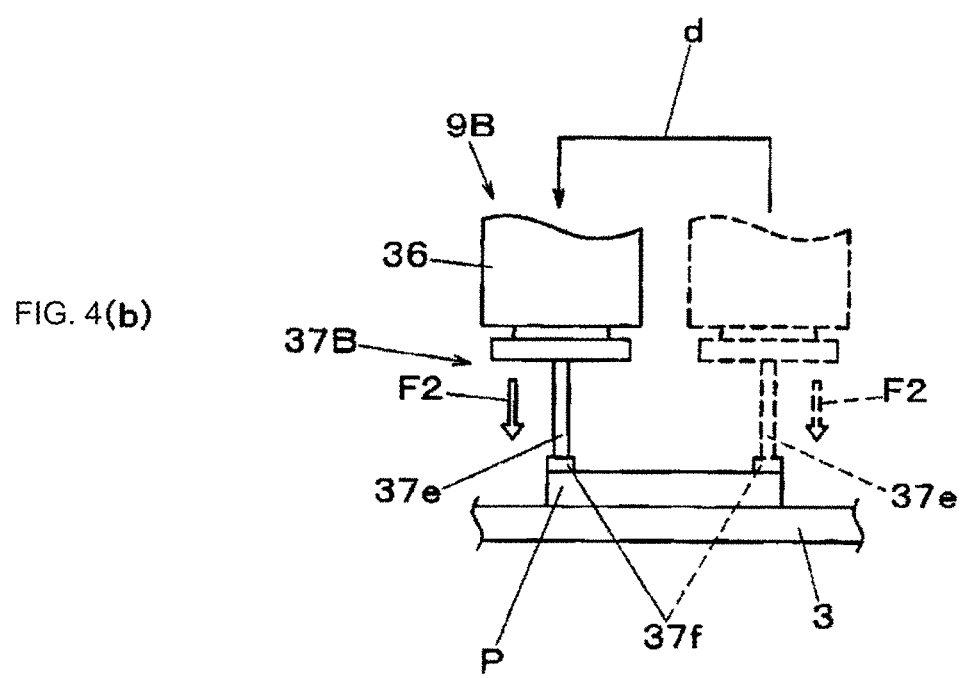

The mounting head 8B is moved to an upper part of the board 3 to move up and down the unit holding head 9B relative to the fitting component P moved and mounted on the component mounting position of the board 3 as illustrated in FIG. 4(b). Thus, the fitting component P as an object to be pressed is pressed by the pressing shaft 37e of the pressing tool 37B as a pressing unit. Then, when the unit holding head 9B is moved (an arrow d), an arbitrary position (here, both end positions on the upper surface) on the upper surface of the fitting component P can be selectively set as the object to be pressed. At this time, the unit holding head 9B presses the fitting component P through the pressing shaft 37e by a second load F2 previously set to a load value larger than the first load F1 for a pushing operation to fit the fitting component P.

Namely, the mounting head 8B functions as a pressing head for carrying out a pressing operation which presses the fitting component P moved and mounted on the component mounting position by the component moving and mounting part A by the pressing shaft 37e of the pressing tool 37B as the pressing unit to attach the fitting component P to the component mounting position as the to-be-attached part. In this configuration, in the tip end part of the pressing shaft 37e as the pressing unit, is provided the cushion member 37f serving as a shock buffer for buffering a shock of a contact surface with the fitting component P. As described above, the diameter dimension d2 which defines a plane sectional form of the pressing shaft 37e as the pressing unit is set to be smaller than the diameter dimension d1 which defines a plane sectional form of the suction shaft 37b as the holding unit.

Figure 5:
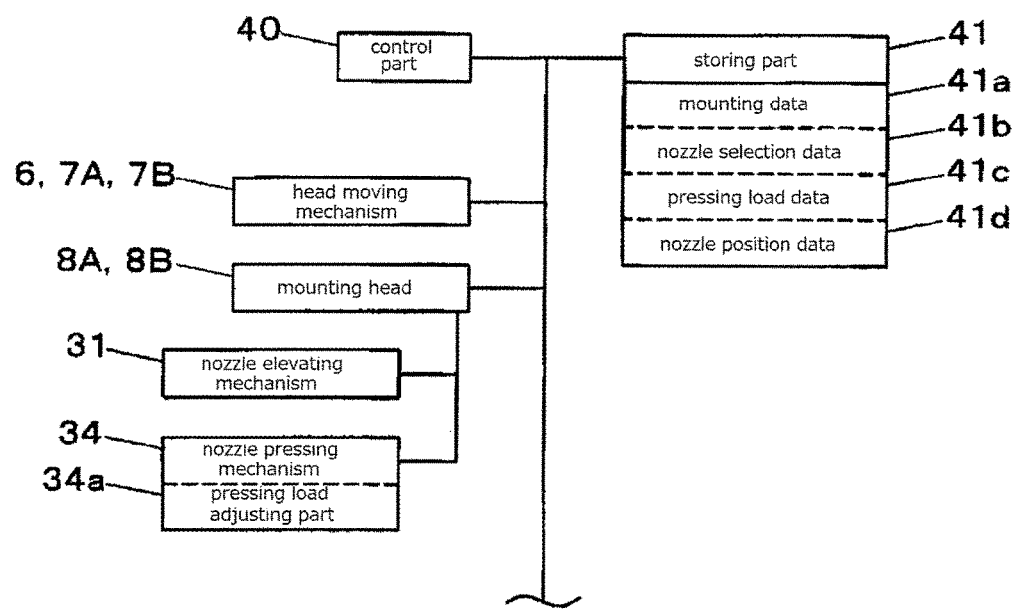
FIG. 5 is a block diagram illustrating a structure of a control system of the component mounting device of the embodiment of the present invention.

Now, by referring to FIG. 5, a structure of a control system will be described below. Here, as a control function of the component mounting device 1, is illustrated only a control function required to carry out a component moving and mounting operation and a component pushing operation when the fitting component P such as the connector component or the shield component is set as the object to be mounted. In FIG. 5, a control part 40 is a calculation processor having a CPU function to control below-described parts respectively in accordance with various kinds of programs or data stored in a storing part 41. The data stored in the storing part 41 includes mounting data 41a, nozzle selection data 41b, pressing load data 41c and nozzle position data 41d.

The mounting data 41a is data which indicates kinds of the components as the objects to be mounted or mounting coordinate data for each kind of the boards. The nozzle selection data 41b is data which defines kinds of the suction nozzle 37A and the pressing tool 37B to be attached to the unit holding head 9A or the unit holding head 9B for each of the objects to be mounted indicated in the mounting data 41a. The pressing load data 41c is data which defines the first load F1 and the second load F2 during the moving and mounting operation or the pushing operation of the fitting component P by the unit holding head 9A or the unit holding head 9B for each of the kinds of the components. The nozzle position data 41d is data which defines a position where the suction shaft 37b is allowed to abut on and suck the fitting component P in the holding operation of the fitting component P by the unit holding head 9A and a position where the pressing shaft 37e is allowed to abut on and press the fitting component P in the pushing operation of the fitting component P by the unit holding head 9B, for each of the kinds of the components.

When the control part 40 controls a head moving mechanism including the Y-axis table 6 and the X-axis tables 7A and 7B and the mounting heads 8A and 8B in accordance with the mounting data 41a and the nozzle selection data 41b, the proper suction nozzle 37A and the pressing tool 37B are attached to the unit holding heads 9A and 9B, then, the fitting component P is taken out from the component tray 5 and moved and mounted on the board 3, and further, the pushing operation is carried out in which the moved and mounted fitting component P is pressed to the to-be-attached part formed on the board 3.

In the moving and mounting operation and the pushing operation, when the control part 40 controls the head moving mechanism, the nozzle elevating mechanisms 31 of the mounting heads 8A and 8B and the nozzle pressing mechanisms 34 in accordance with the pressing load data 41c and the nozzle position data 41d, a proper holding position of the fitting component P which is previously prescribed is sucked and held and a proper pressing position of the fitting component P is pressed by a proper pressing load which is previously prescribed. Accordingly, when the control part 40 controls the mounting heads 8A and 8B moved by the head moving mechanism, the control part 40 functions as a head control part by which a neighborhood of a central portion on the upper surface of the fitting component P is sucked and held in the moving and mounting operation and a press part is pressed which is set so as to correspond to the to-be-attached part in the pressing operation.

Figure 6:
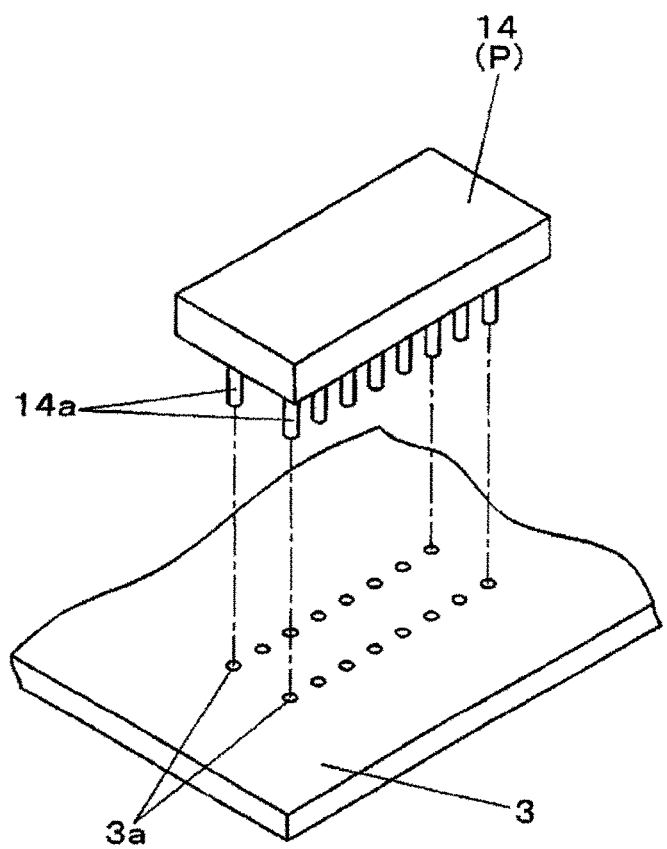
FIG. 6 is a perspective view of a connector component of a first example as an object to be mounted in a component mounting method of one embodiment of the present invention.

Now, by referring to FIG. 6 and FIG. 7(a) to FIG. 7(e), will be described a component mounting example (a first example) when the fitting component P as the object to be attached is the connector component 14. As illustrated in FIG. 6, in a lower surface of the connector component 14, a plurality of fitting pins 14a for connection are provided. Further, in the component mounting position as the to-be-attached part in which the connector component 14 is attached to the board 3, a plurality of fitting holes 3a are formed correspondingly to positions of the fitting pins 14a. In mounting the connector component 14 on the board 3, the connector component 14 is moved and mounted on the component mounting position to attach the fitting pins 14a to the fitting holes 3a by a mechanical fitting.

Figure 7:
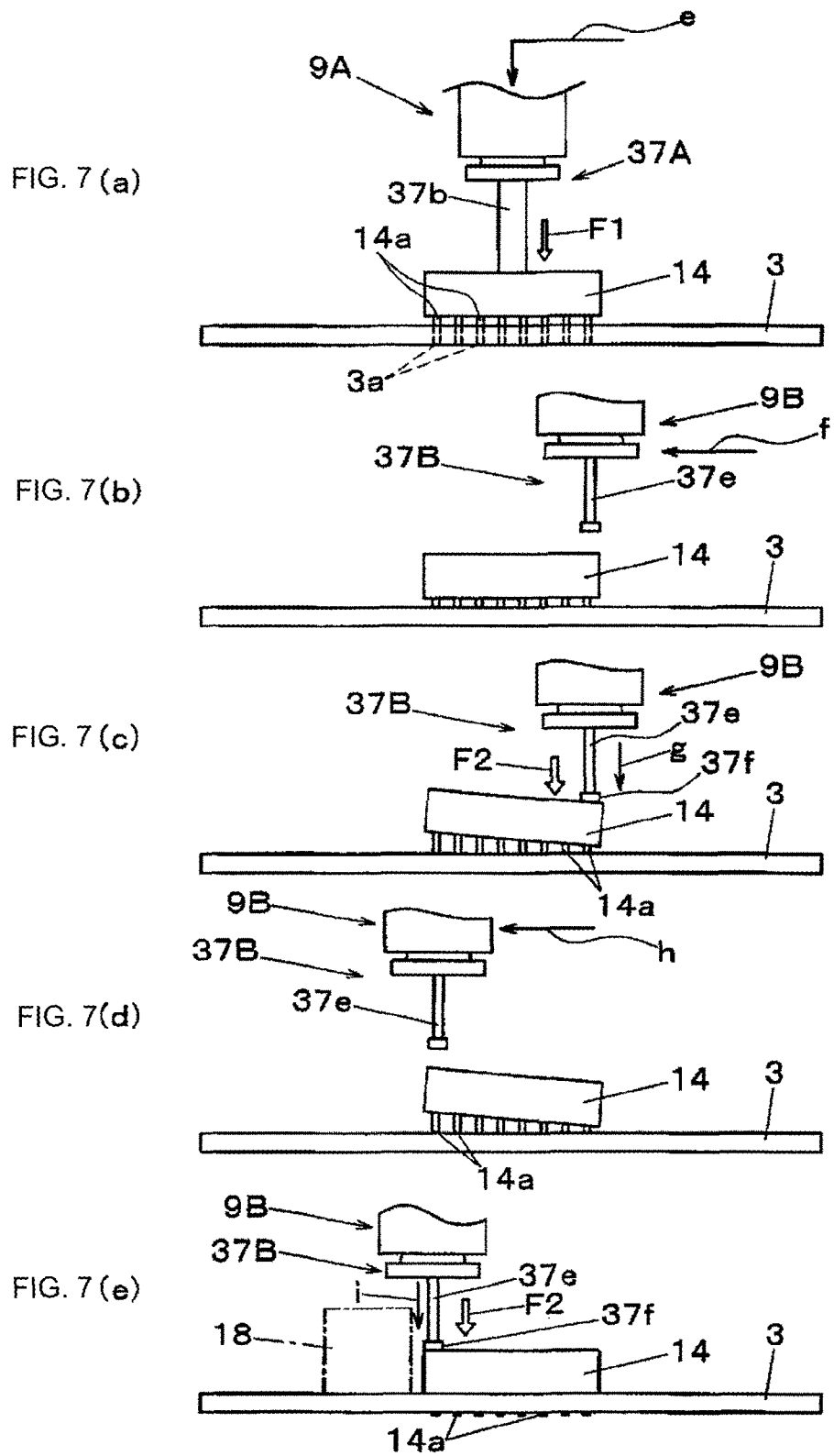
FIGS. 7(a), 7(b), 7(c), 7(d) and 7(e) are process explanatory views of the first example in the component mounting method of the embodiment of the present invention.

In the component mounting operation, initially, the connector component 14 is held and taken out from the component tray 5 by the suction nozzle 37A attached to the unit holding head 9A as the moving and mounting head. Then, as illustrated in FIG. 7(a), the connector component 14 is moved (an arrow e) to the upper part of the board 3, mounted on the component mounting position as the to-be-attached part of the board 3 and pressed by the first load F1 (a moving and mounting process). Thus, the fitting pins 14a in the lower surface of the connector component 14 are respectively positioned with the corresponding fitting holes 3a. After that, the connector component 14 moved and mounted on the component mounting position is pressed by the second load F2 by the pressing tool 37B attached to the unit holding head 9B as the pressing head, so that the connector component 14 is attached to the component mounting position (a pressing process).

In the pressing process, as illustrated in FIG. 7(b), the unit holding head 9B to which the pressing tool 37B is attached is moved (an arrow f) to an upper part of the connector component 14 to position the pressing shaft 37e to a position (here, an end part on the upper surface of the connector component 14) previously prescribed as a press part on the upper surface of the connector component 14. Then, as illustrated in FIG. 7(c), the pressing tool 37B is lowered (an arrow g) by the unit holding head 9B to allow the pressing shaft 37e to abut on the upper surface of the connector component 14 through the cushion member 37f and press the connector component 14 by the second load F2 which is previously prescribed to properly push the fitting pins 14a. Thus, the fitting pins 14a of the plurality of fitting pins 14a located below the press part are pushed and fitted to the fitting holes 3a. However, in an end part of the other side which is not pressed, the fitting pins 14a are in a state that the fitting pins 14a are not fitted to the fitting holes 3a and float from the board 3.

After that, as illustrated in FIG. 7(d), the unit holding head 9B is moved (an arrow h) to position the pressing shaft 37e to the end part of the other side of the connector component 14. Then, as illustrated in FIG. 7(e), the pressing tool 37B is lowered (an arrow i) to allow the pressing shaft 37e to abut on the upper surface of the other end part of the connector component 14 through the cushion member 37f and to press the connector component 14 by the second load F2. Thus, the fitting pins 14a in the state that they are not fitted to the fitting holes 3a and float from the board 3 are pushed and fitted to the fitting holes 3a, so that the mounting operation of the connector component 14 is completed.

At this time, since the cushion member 37f which functions as the shock buffer is attached to the tip end part of the pressing shaft 37e, during a pressing operation by the pressing shaft 37e, is prevented an impact or a breakage due to a direct contact of the pressing shaft 37e made of metal with the connector component 14. Further, as described above, the diameter dimension d2 (see FIG. 4(a)) of the pressing shaft 37e is set to be small as much as possible. Accordingly, even when a proximity component 18 having a larger height exists near the connector component 14, an occurrence of inconvenience that the pressing shaft 37e interferes with the proximity component 18 can be prevented. When the press part is set, the number or arrangement of press points is suitably selected by considering the form or size of the connector component 14 as the object, a fitting resistance of the fitting pins 14a or the like.

Figure 8:
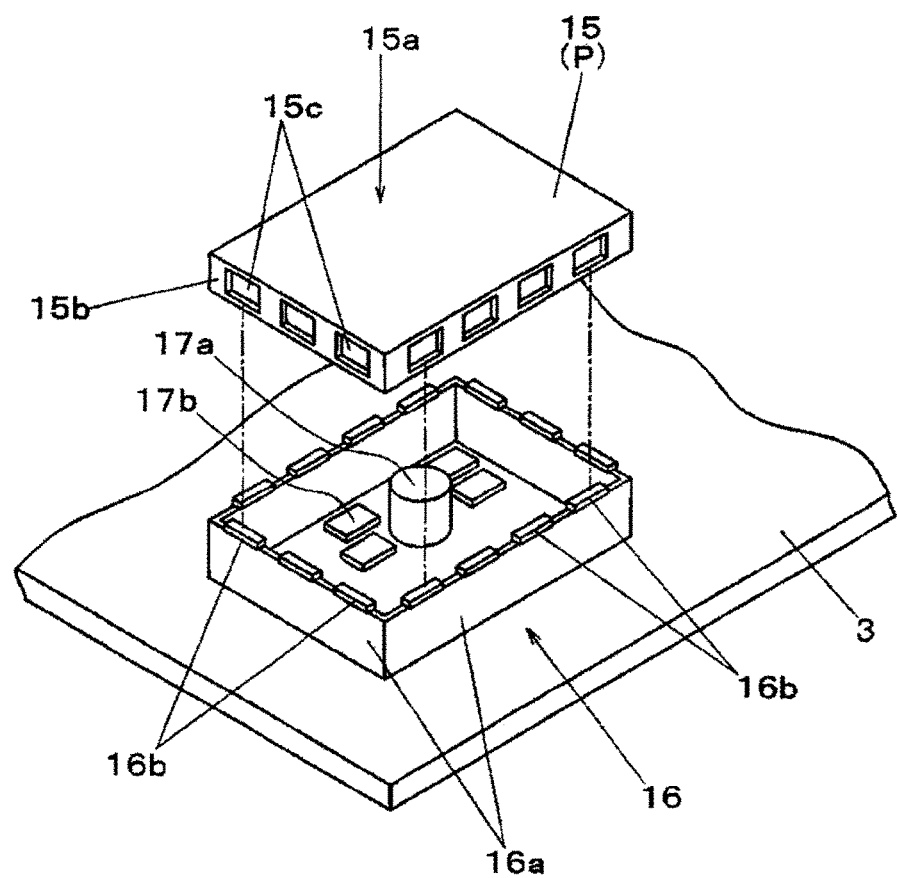
FIG. 8 is a perspective view of a shield component of a second example as an object to be mounted in the component mounting method of the embodiment of the present invention.

Now, by referring to FIG. 8 and FIGS. 9(a) to 9(c), will be described a component mounting example (a second example) when the fitting component P as the object to be attached is a shield cover component 15. As illustrated in FIG. 8, a shield frame component 16 is previously mounted in a shield range set on a mounting surface of the board 3 on which already-mounted components 17a and 17b are mounted. The shield frame component 16 includes, as a main body, side wall parts 16a to form a frame with an upper part opened. In upper end parts of the side wall parts 16a, engaging parts 16b are formed at prescribed positions which extend outward and sideward. To the upper part of the shield frame component 16, the shield cover component 15 having a form in which side wall parts 15b are extended downward from edge parts of a rectangular and planar upper surface part 15a is attached to cover the opening. Thus, a shield part is formed which electro-magnetically shields the shield range.

Figure 9A:
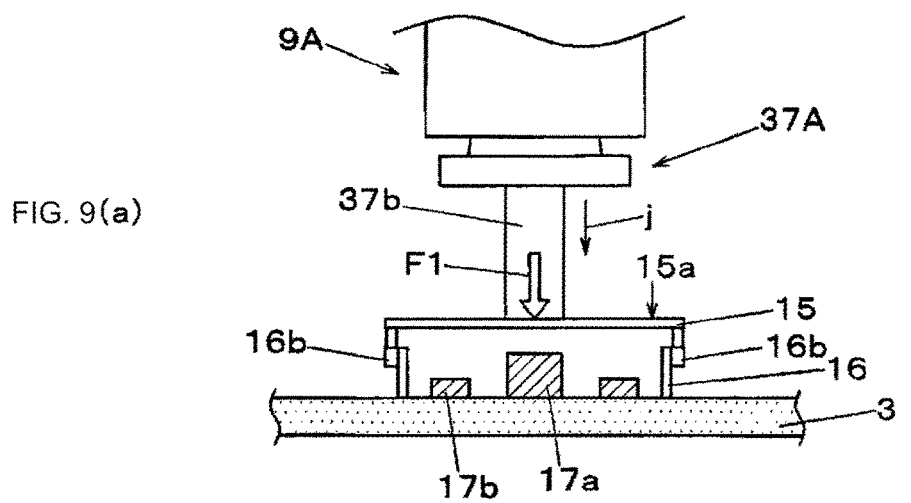
FIGS. 9(a), 9(b) and 9(c) are process explanatory views of the second example in the component mounting method of the embodiment of the present invention.

When the shield cover component 15 as a fitting member is attached to the shield frame component 16 as the to-be-attached part, the shield cover component 15 is pressed to the shield frame component 16 from an upper part to allow the engaging parts 16b to be engaged with engagement opening parts 15c provided on the side wall parts 15b so as to correspond to positions of the engaging parts 16b. In an attaching operation of the shield cover component 15, initially, the shield cover component 15 is sucked and held and taken out from the component tray 5 by the unit holding head 9A, moved and mounted on the shield frame component 16 as the to-be-attached part which is previously mounted on the board 3 as illustrated in FIG. 9(a) and pressed by the first load F1 (a moving and mounting process).

At this time, a neighborhood of a central portion of the upper surface part 15a of the shield cover component 15 is sucked and held by the suction shaft 37b of the suction nozzle 37A attached to the unit holding head 9A, and the shield cover component 15 is pressed to the shield frame component 16 under this state. Here, since the first load F1 merely has a load value necessary and sufficient to stably mount the shield cover component 15 on the shield frame component 16, even when the central portion of the upper surface part 15a as a planar member which is thin and liable to be bent is pressed, a quantity of bending by the pressure is small. Thus, failure can be prevented that the upper surface part 15a is pressed to the already-mounted component 17a to cause damage of the component.

Figure 9B:
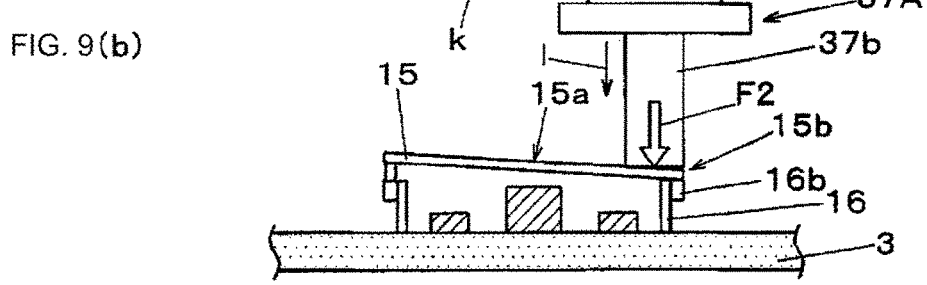

After that, the shield cover component 15 moved and mounted on the upper part of the shield frame component 16 is pressed under the second load F2 larger than the first load F1 by the suction nozzle 37A attached to the unit holding head 9A to attach the shield cover component 15 to the shield frame component 16 (a pressing process). In the pressing process, as illustrated in FIG. 9(b), the unit holding head 9A is moved (an arrow k) above the shield cover component 15. The suction shaft 37b is positioned to a previously prescribed position (here, an end part on the upper surface part 15a) correspondingly to the shield frame component 16 in the upper surface of the shield cover component 15 and the suction nozzle 37A is lowered (an arrow 1) to allow the suction shaft 37b to abut on the upper surface part 15a of the shield cover component 15 and press the shield cover component 15 by the second load F2. Thus, the side wall parts 15b are bent and deformed and pushed so that the engaging parts 16b are engaged with the engagement opening parts 15c.

Figure 9C:
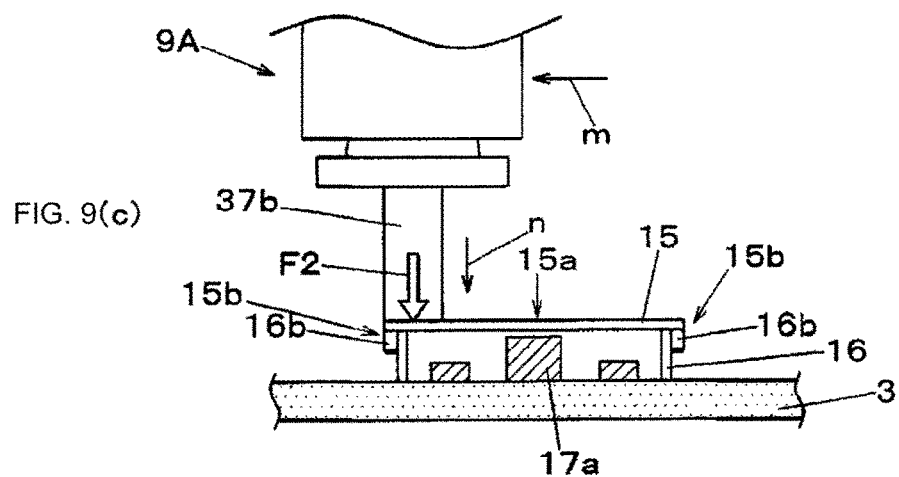

Subsequently, as illustrated in FIG. 9(c), the unit holding head 9A is moved (an arrow m) and the suction shaft 37b is positioned to an end part pf the other side of the upper surface part 15a. The suction nozzle 37A is lowered (an arrow n) to allow the suction shaft 37b to abut on the upper surface part 15a of the shield cover component 15 and press the shield cover component 15 by the second load F2. Thus, as described above, the engaging parts 16b are engaged with the engagement opening parts 15c and both the end parts of the shield cover component 15 are engaged with the shield frame component 16 to complete an attachment of the shield cover component 15 to the shield frame component 16. When the press part is set, the number or arrangement of press points are suitably selected by considering the form, the size or rigidity in a vertical direction and an engagement resistance to the engaging parts 16b of the shield frame component 16 of the shield cover component 15 as the object.

Namely, when the shield cover component 15 is attached to the shield frame component 16, the mounting head 8A is controlled so that the neighborhood of the central portion of the upper surface part 15a of the shield cover component 15 is sucked and held in the moving and mounting operation, and in the pressing operation, the press part is pressed which is set in accordance with the shield frame component 16. In the above-described example, the moving and mounting operation and the pressing operation are carried out only by using the unit holding head 9A of the mounting head 8A, however, the moving and mounting operation may be carried out by the unit holding head 9A of the mounting head 8A and the pressing operation may be carried out by the unit holding head 9B of the mounting head 8B.

As described above, in the component mounting device and the component mounting method illustrated in the present embodiment, when the fitting component P to be attached by the mechanical fitting or the engagement to the to-be-attached part is mounted on the board 3, the fitting component P is held and taken out by the holding unit attached to the moving and mounting head from the component supply part 4 to move and mount the fitting component P on the to-be-attached part of the board 3, and the moved and mounted fitting component P is pressed by the pressing unit attached to the pressing head separate from the moving and mounting head to attach the fitting component P to the to-be-attached part. Thus, the pressing force can be constantly properly maintained during the pushing operation, and the component moving and mounting operation and the pushing operation for the fitting component P as an object to be mounted can be stably carried out.

Further, in the component mounting device and the component mounting method illustrated in the present embodiment, the component mounting operation includes a moving and mounting process which sucks and holds the fitting component P to take out the fitting component P from the component supply part 4, moves and mounts the fitting component P on the to-be-attached part of the board 3 and presses the fitting component P by the first load and a pressing process which presses the moved and mounted fitting component P by the second load F2 larger than the first load F1 to attach the fitting component P to the to-be-attached part. In the moving and mounting process of the component mounting operation, the neighborhood of the central portion of the upper surface of the fitting component P is sucked and held, and in the pressing process, the press part is pressed which is set in accordance with the to-be-attached part. Thus, even when the fitting component which is liable to be bent like the shield cover component 15 is set as the object to be mounted, an inconvenience due to the bending of the component does not arise, and the component moving and mounting operation and the pushing operation can be stably carried out.

This application is based on Japanese patent application (JPA No. 2013-031681) filed on Feb. 21, 2013 and contents thereof are incorporated herein by reference.

INDUSTRIAL APPLICABILITY

The component mounting device and the component mounting method of the present invention have an effect that the component moving and mounting operation and the pushing operation for the fitting components as objects to be mounted can be stably carried out, and are available for the component mounting operation in which electronic components including the fitting component such as the connector component or the shield component to be attached by a mechanical fitting or engagement are mounted on the board.

REFERENCE SIGNS LIST 1 component mounting device
3 board
4 component supply part
5 component tray 6 Y-axis table
7A, 7B X-axis table
8A, 8B mounting head
9A, 9B unit holding head
14 connector component
15 shield cover component
16 shield frame component
37A suction nozzle
37B pressing tool
37b suction shaft
37e pressing shaft
37f cushion member
A component moving and mounting part
B component pressing part
P fitting component
F1 first load
F2 second load

The invention claimed is:

1. A component mounting method that mounts electronic components on a board, the electronic components including a fitting component to be attached by a mechanical fitting or engagement to a to-be-attached part formed in the board, the component mounting method comprising:

a moving and mounting process of holding and taking out the fitting component by a holding unit attached to a moving and mounting head from a component supply part to move and mount the fitting component on the to-be-attached part of the board; and a pressing process of pressing the fitting component that is moved and mounted on the to-be-attached part by a pressing unit attached to a pressing head to attach the fitting component to the to-be-attached part, wherein a planar shape of a tip of the pressing unit intended to contact with the fitting component is smaller than a planar shape of a tip of the holding unit intended to contact with the fitting component, and wherein in the pressing process, the pressing unit presses different positions of an upper surface of the fitting component at different timings, respectively.

2. The component mounting method according to claim 1, wherein a contact surface with the fitting component is buffered by a shock buffer provided in a tip end part of the pressing unit.

3. The component mounting method according to claim 1, wherein the pressing unit has a plane sectional form smaller than a plane sectional form of the holding unit and presses the fitting component.

\* \* \* \* \*